United States Patent
Cheng et al.

(10) Patent No.: US 10,720,528 B2
(45) Date of Patent: Jul. 21, 2020

(54) METHOD AND STRUCTURE OF STACKED FINFET

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/057,250

(22) Filed: Aug. 7, 2018

(65) Prior Publication Data
US 2018/0350989 A1  Dec. 6, 2018

Related U.S. Application Data

(62) Division of application No. 14/936,069, filed on Nov. 9, 2015, now Pat. No. 10,084,090.

(51) Int. Cl.
| | |
|---|---|
| *H01L 29/78* | (2006.01) |
| *H01L 29/06* | (2006.01) |
| *H01L 21/18* | (2006.01) |
| *H01L 29/161* | (2006.01) |
| *H01L 29/16* | (2006.01) |

(Continued)

(52) U.S. Cl.
CPC .... *H01L 29/7849* (2013.01); *H01L 21/02532* (2013.01); *H01L 21/02636* (2013.01); *H01L 21/18* (2013.01); *H01L 21/283* (2013.01); *H01L 29/0657* (2013.01); *H01L 29/16* (2013.01); *H01L 29/161* (2013.01); *H01L 29/66795* (2013.01); *H01L 29/785* (2013.01); *H01L 29/165* (2013.01)

(58) Field of Classification Search
None
See application file for complete search history.

(56) References Cited

U.S. PATENT DOCUMENTS

| | | | |
|---|---|---|---|
| 6,413,802 | B1 | 7/2002 | Hu et al. |
| 8,048,723 | B2 | 11/2011 | Chang et al. |

(Continued)

OTHER PUBLICATIONS

Batude, P., et al., "3D monolithic integration" 2011 IEEE International Symposium on Circuits and Systems (ISCAS), (May 15-18, 2011) pp. 2233-2236.

(Continued)

*Primary Examiner* — Charles D Garber
*Assistant Examiner* — Xiaoming Liu
(74) *Attorney, Agent, or Firm* — Scully, Scott, Murphy & Presser, P.C.; Alvin Borromeo, Esq.

(57) ABSTRACT

A semiconductor structure is provided that includes a fin stack structure of, from bottom to top, a first semiconductor material fin portion, an insulator fin portion and a second semiconductor material fin portion. The first semiconductor material fin portion can be used as a first device region in which a first conductivity-type device (e.g., n-FET or p-FET) can be formed, while the second semiconductor material fin portion can be used as a second device region in which a second conductivity-type device (e.g., n-FET or p-FET), which is opposite the first conductivity-type device, can be formed.

12 Claims, 4 Drawing Sheets

(51) Int. Cl.
*H01L 21/283* (2006.01)
*H01L 21/02* (2006.01)
*H01L 29/66* (2006.01)
*H01L 29/165* (2006.01)

(56) References Cited

U.S. PATENT DOCUMENTS

| | | | |
|---|---|---|---|
| 8,450,804 B2 | 5/2013 | Sekar et al. | |
| 8,536,023 B2 | 9/2013 | Or-Bach et al. | |
| 8,581,349 B1 | 11/2013 | Sekar et al. | |
| 8,642,416 B2 | 2/2014 | Or-Bach et al. | |
| 8,703,556 B2 | 4/2014 | Kelly et al. | |
| 8,742,511 B2 | 6/2014 | Chang et al. | |
| 8,963,251 B2 | 2/2015 | Lee et al. | |
| 9,276,114 B2 | 3/2016 | Colinge et al. | |
| 2005/0020020 A1 | 1/2005 | Collaert | |
| 2006/0220134 A1* | 10/2006 | Huo | H01L 21/84 257/351 |
| 2010/0219479 A1 | 9/2010 | Nuttinck | |
| 2011/0147811 A1* | 6/2011 | Kavalieros | H01L 29/66795 257/288 |
| 2011/0316044 A1* | 12/2011 | Chan | H01L 21/823807 257/190 |
| 2013/0234215 A1 | 9/2013 | Okano | |
| 2013/0299080 A1* | 11/2013 | Plach | H01L 21/187 156/272.6 |
| 2014/0091361 A1 | 4/2014 | Goel et al. | |
| 2014/0175554 A1 | 6/2014 | Loubet et al. | |
| 2014/0273365 A1* | 9/2014 | Wei | H01L 21/823821 438/199 |
| 2015/0028348 A1 | 1/2015 | Jacob et al. | |
| 2015/0041908 A1* | 2/2015 | Adam | H01L 21/823821 257/369 |
| 2015/0069527 A1 | 3/2015 | Kerber et al. | |

OTHER PUBLICATIONS

List of IBM Patents or Patent Applications Treated As Related dated Aug. 7, 2018, 2 pages.

* cited by examiner

METHOD AND STRUCTURE OF STACKED FINFET

BACKGROUND

The present application relates to semiconductor technology, and more particularly to a semiconductor structure including a fin stack structure of, from bottom to top, a first semiconductor material fin portion, an insulator fin portion and a second semiconductor material fin portion. The present application also relates to a method of forming such a semiconductor structure.

The continued miniaturization of metal oxide semiconductor field effect transistors (MOSFETs) has driven the worldwide semiconductor industry. The use of non-planar semiconductor devices such as, for example, Fin field effect transistors (FinFETs) is the next step in the evolution of complementary metal oxide semiconductor (CMOS) devices. FinFETs can achieve higher drive currents with increasingly smaller dimensions as compared to conventional planar FETs.

In such non-planar semiconductor devices, a first set of semiconductor fins is formed within a first device region in which a first conductivity type device (i.e., n-FET or p-FET) can be subsequently formed, and a second set of semiconductor fins, which lie laterally adjacent to the first set of semiconductor fins, is formed in a second device region in which a second conductivity type device, that is opposite to the first conductivity type device, can be subsequently formed. A trench isolation structure is typically formed between the first and second device regions.

Stacked semiconductor fins in which the semiconductor fins are formed one atop another afford higher density than their non-stacked semiconductor fin counterparts. In devices containing stacked semiconductor fins, tensily strained semiconductor fins for providing n-FET devices are formed in one area of the substrate, while compressively strained semiconductor fins for p-FET devices are formed in another area that is laterally adjacent to the area including the n-FET devices.

SUMMARY

A semiconductor structure is provided that includes a fin stack structure of, from bottom to top, a first semiconductor material fin portion, an insulator fin portion and a second semiconductor material fin portion. The first semiconductor material fin portion can be used as a first device region in which a first conductivity-type device (e.g., n-FET or p-FET) can be formed, while the second semiconductor material fin portion can be used as a second device region in which a second conductivity-type device (e.g., n-FET or p-FET), which is opposite the first conductivity-type device, can be formed. In some embodiments, the first semiconductor material fin portion may include tensely strained Si and be used as an n-FET device region, while the second semiconductor material fin portion may include compressively strained Si or a silicon germanium alloy and be used as a p-FET device region. In another embodiment, the first semiconductor material fin portion may include compressively strained Si or a silicon germanium alloy and be used as a p-FET device region, while the second semiconductor material fin portion may include tensily strained Si and be used as an n-FET device region.

In one aspect of the present application, a semiconductor structure is provided. In one embodiment of the present application, the semiconductor structure includes at least one fin stack structure extending upwards from a surface of an insulator layer. The at least one fin stack structure comprises, from bottom to top, a first semiconductor material fin portion, an insulator fin portion and a second semiconductor material fin portion. A functional gate structure straddles over a portion of the at least one fin stack structure. A first epitaxial semiconductor material structure is located on sidewall surfaces of the first semiconductor material fin portion that extend outwards from the functional gate structure. A second epitaxial semiconductor material structure is located on a topmost surface and sidewall surfaces of the second semiconductor material fin portion that extend outwards from the functional gate structure. In accordance with some embodiments of the present application, the second epitaxial semiconductor material structure includes a different semiconductor material than a semiconductor material of the first epitaxial semiconductor material structure.

In another embodiment of the present application, the semiconductor structure includes at least one fin stack structure extending upwards from a surface of an insulator layer, the at least one fin stack structure comprises, from bottom to top, a first semiconductor material fin portion, an insulator fin portion and a second semiconductor material fin portion. A functional gate structure straddles over a portion of the at least one fin stack structure (other portions of the first semiconductor material fin portion and the insulator fin portion, but not the second semiconductor material fin portion, extend outwards from both sides of the functional gate structure). A first epitaxial semiconductor material structure is located on sidewall surfaces of the first semiconductor material fin portion that extends outward from the functional gate structure. A second epitaxial semiconductor material structure is located above a topmost surface of the insulator fin portion that extends outwards from the functional gate structure. In accordance with some embodiments of the present application, the second epitaxial semiconductor material structure includes a different semiconductor material than a semiconductor material of the first epitaxial semiconductor material structure.

In another aspect of the present application, a method of forming a semiconductor structure is provided. In one embodiment of the present application, the method includes providing a material stack of, from bottom to top, a handle substrate, a first insulator layer, a first semiconductor material layer, a second insulator layer and a second semiconductor material layer. Next, the second semiconductor material layer, the second insulator layer and the first semiconductor material layer are patterned to provide at least one fin stack structure extending upwards from a portion of the first insulator layer. The at least one fin stack structure comprises, from bottom to top, a first semiconductor material fin portion, an insulator fin portion and a second semiconductor material fin portion. A gate structure is then formed straddling over a portion of the at least one fin stack structure. Next, a first epitaxial semiconductor material structure is formed from exposed surfaces of the first semiconductor material fin portion and a second epitaxial semiconductor material structure is formed from exposed surfaces of the second semiconductor material fin portion. In accordance with the present application, the first and second epitaxial semiconductor material structures are formed utilizing maskless epitaxial growth (or deposition) processes.

DETAILED DESCRIPTION

Figure 1:
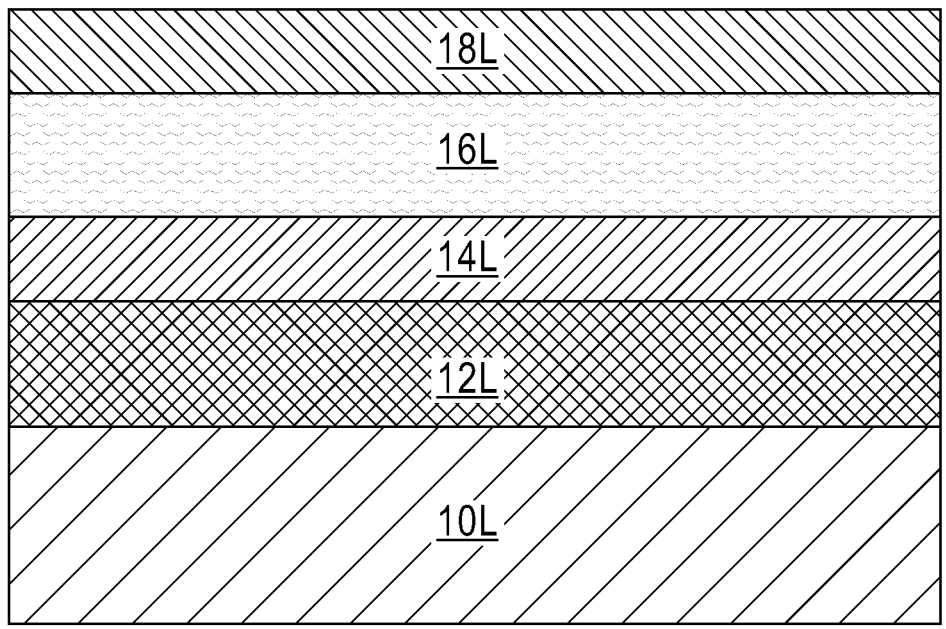
FIG. 1 is a cross sectional view of an exemplary semiconductor structure that includes, from bottom to top, a handle substrate, a first insulator layer, a first semiconductor material layer, a second insulator layer, and a second semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure (i.e., a material stack) that includes, from bottom to top, a handle substrate 10L, a first insulator layer 12L, a first semiconductor material layer 14L, a second insulator layer 16L, and a second semiconductor material layer 18L that can be employed in accordance with an embodiment of the present application.

In one embodiment of the present application, the handle substrate 10L may include at least one semiconductor material that has semiconductor properties. Examples of materials that have semiconducting properties and thus can be employed as the semiconductor material that provides the handle substrate 10L include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the handle substrate 10L is composed entirely of silicon.

In another embodiment of the present application, the handle substrate 10L may be composed of a non-semiconductor material including, for example, a dielectric material and/or a conductive material.

When the handle substrate 10L is composed of at least one semiconductor material, the at least one semiconductor material that provides the handle substrate 10L may be single crystalline, polycrystalline or amorphous. In one example, the handle substrate 10L is composed of single crystalline silicon.

When the handle substrate 10L is composed of at least one semiconductor material, the at least one semiconductor material that provides the handle substrate 10L may have any of the well known crystal orientations. For example, the crystal orientation of the handle substrate 10L may be 11001, 11101, or 11111. Other crystallographic orientations besides those specifically mentioned can also be used in the present application.

The first insulator layer 12L of the exemplary semiconductor structure shown in FIG. 1 may be a crystalline or non-crystalline dielectric material such as an oxide and/or nitride. In one embodiment, the first insulator layer 12L is a dielectric oxide such as, for example, silicon dioxide. In another embodiment of the present application, the first insulator layer 12L may be a dielectric nitride such as, for example, silicon nitride or boron nitride. In yet another embodiment of the present application, the first insulator layer 12L may include a stack of a dielectric oxide and a dielectric nitride. In one example, a stack of, in any order, silicon dioxide and silicon nitride or boron nitride may be employed as the first insulator layer 12L. The first insulator layer 12L may have a thickness from 10 nm to 200 nm, although other thicknesses that are lesser than, or greater than, the aforementioned thickness range may also be employed as the thickness of the first insulator layer 12L.

The first semiconductor material layer 14L includes one of the semiconductor materials mentioned above for the handle substrate 10L. The semiconductor material (i.e., first semiconductor material) that provides the first semiconductor material layer 14L may be a relaxed semiconductor material or a strained (e.g., tensily or compressively strained) semiconductor material. In one embodiment, the first semiconductor material includes a same semiconductor material as the handle substrate 10L. In one example, silicon is employed as the semiconductor material for both the handle substrate 10L and the first semiconductor material layer 14L. In another embodiment, the first semiconductor material layer 14L includes a semiconductor material that differs from a semiconductor material that provides the handle substrate 10L. In one example, the handle substrate 10L may be composed of silicon, while the first semiconductor material layer 14L may be composed of a silicon germanium alloy.

The first semiconductor material layer 14L may have one of the crystal orientations mentioned above for the semiconductor material that provides the handle substrate 10L. In one embodiment, the crystal orientation of the first semiconductor material 14L is the same as the crystal orientation of the handle substrate 10L. In another embodiment, the crystal orientation of the first semiconductor material layer 14L differs from the crystal orientation of the handle substrate 10L. Typically, the first semiconductor material layer 14L is a single crystalline semiconductor material. The first semiconductor material layer 14L may have a thickness from 10 nm to 100 nm, although other thicknesses that are lesser than, or greater than, the aforementioned thickness range may also be employed as the thickness of the first semiconductor material layer 14L.

The second insulator layer 16L of the exemplary semiconductor structure shown in FIG. 1 may include one of the dielectric materials mentioned above for the first insulator layer 12L. In one embodiment, the second insulator layer 16L is composed of a same dielectric material as the first insulator layer 12L. In another embodiment of the present application, the second insulator layer 16L is composed of a dielectric material that differs from the dielectric material of the first insulator layer 12L. The second insulator layer 16L may have a thickness within the range mentioned above for the first insulator layer 12L. The thickness of the second insulator layer 16L may be the same as, or different from, the thickness of the first insulator layer 12L.

The second semiconductor material layer 18L includes one of the semiconductor materials mentioned above for the handle substrate 10L. The semiconductor material (i.e., second semiconductor material) that provides the second semiconductor material layer 18L may be a relaxed semiconductor material or a strained (e.g., tensily or compressively strained) semiconductor material. In one embodiment, the second semiconductor material includes a same semiconductor material as the first semiconductor material 14L. In one example, silicon is employed as the semiconductor material for both the first and second semiconductor material layers 14L, 18L. In another embodiment, the second semiconductor material layer 18L includes a semiconductor material that differs from a semiconductor material that provides the first semiconductor material layer 14L. In one example, the first semiconductor material layer 14L may be composed of silicon, while the second semiconductor material layer 18L may be composed of a silicon germanium alloy.

The second semiconductor material layer 18L may have one of the crystal orientations mentioned above for the semiconductor material that provides the handle substrate 10L. In one embodiment, the crystal orientation of the second semiconductor material 18L is the same as the crystal orientation of the first semiconductor material layer 14L. In another embodiment, the crystal orientation of the second semiconductor material layer 18L differs from the crystal orientation of the first semiconductor material layer 14L. Typically, the second semiconductor material layer 18L is a single crystalline semiconductor material. The second semiconductor material layer 18L may have a thickness from 10 nm to 100 nm, although other thicknesses that are lesser than, or greater than, the aforementioned thickness range may also be employed as the thickness of the second semiconductor material layer 18L. The thickness of the second semiconductor material layer 18L may be the same as, or different from, the thickness of the first semiconductor material layer 14L.

The exemplary semiconductor structure (i.e., material stack) shown in FIG. 1 can be formed utilizing any well known process. In one embodiment of the present application, the exemplary semiconductor structure shown in FIG. 1 can be formed by providing a first substrate including, from bottom to top, the handle substrate 10L, the first insulator layer 12L, and the first semiconductor material layer 14L. Collectively, the first substrate (10L, 12L, 14L) may be referred to herein as a semiconductor-on-insulator (SOI) substrate. In one embodiment, the first substrate (10L, 12L, 14L) may be formed by wafer bonding. In yet another embodiment, the first substrate (10L, 12L, 14L) may be formed by an implantation process known as SIMOX (i.e., Separation by IMplanting OXygen). In some embodiments of the present application, a thermal mixing process or a thermal condensation process (as described below) may be employed in forming the first semiconductor material layer 14L.

A second substrate is also provided (either before, simultaneously with, or after providing the first substrate). In one embodiment, the second substrate includes, from bottom to top, the second semiconductor material layer 18L and the second insulator layer 16L The second substrate (16L, 18L) can be formed by depositing or thermally growing the second insulator layer 16L onto a surface of the second semiconductor material 18L. In some embodiments, a sacrificial semiconductor material or material stack can be used as the semiconductor component of the second substrate and after bonding, the sacrificial semiconductor material or material stack can be converted into the second semiconductor material layer 18L utilizing a thermal mixing process or a thermal condensation process. In one example, a sacrificial material stack of silicon and a silicon germanium alloy having a first germanium content can be converted into a silicon germanium alloy having a second germanium content that differs from the first germanium content. Thermal mixing includes annealing in an inert ambient (i.e., helium and/or argon), while thermal condensation includes annealing in an oxidizing ambient (air, oxygen, ozone and/or $NO_2$). The anneal temperature for both thermal mixing and thermal condensation can be from 600° C. to 1200° C.

Next, the first substrate is bonded to the second substrate. Bonding includes contacting an exposed surface of the second insulator layer 16L of the second substrate to an exposed surface of the first semiconductor material layer 14L of the first substrate. Bonding can be performed utilizing any bonding temperature including, for example, from room temperature (20° C.) up to 1200° C. Bonding can be performed in an inert ambient and an external force may or may not be applied during a part of, or an entirety of, the bonding process.

Figure 2:
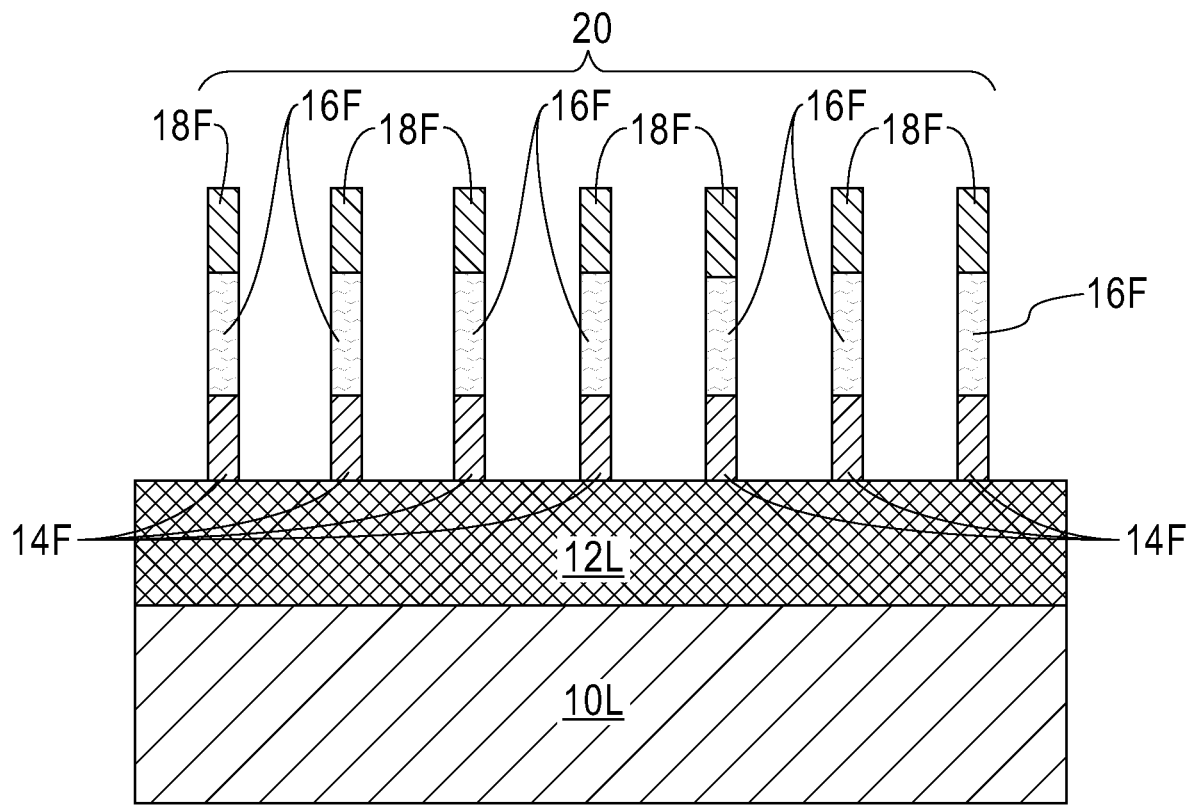
FIG. 2 is a cross sectional view of the exemplary semiconductor structure of FIG. 1 after patterning the second semiconductor material layer, the second insulator layer and the first semiconductor material layer to provide a plurality of fin stack structures extending upwards from different portions of the first insulator layer.

Referring now to FIG. 2, there is illustrated the exemplary semiconductor structure of FIG. 1 after patterning the second semiconductor material layer 18L, the second insulator layer 16L and the first semiconductor material layer 14L to provide a plurality of fin stack structures 20 extending upwards from different portions of the first insulator layer 12L. Each fin stack structure 20 includes, from bottom to top, a remaining portion of the first semiconductor material layer 14L, a remaining portion of the second insulator layer 16L, and a remaining portion of the second semiconductor material layer 18L. Each remaining portion of the first semiconductor material layer 14L can be referred to herein as a first semiconductor material fin portion 14F, each remaining portion of the second insulator layer 16L can be referred to herein as an insulator fin portion 16F, and each remaining portion of the second semiconductor material layer 18L can be referred to herein as a second semiconductor material fin portion 18F.

Although the present application describes and illustrates a plurality of fin stack structures 20, the present application can also be employed when a single fin stack structure 20 is formed from the second semiconductor material layer 18L, the second insulator layer 16L and the first semiconductor material layer 14L.

As is shown, each second semiconductor material fin portion 18F is completely isolated from a corresponding and underlying first semiconductor material fin portion 14F by the insulator fin portion 16F. As is further shown, the sidewall surfaces of the second semiconductor material fin portion 18F of an individual fin stack structure 20 are vertically aligned with the sidewall surfaces of both the underlying insulator fin portion 16F and the first semiconductor material fin structure 14F.

In one embodiment of the present application, the patterning of the second semiconductor material layer 18L, the second insulator layer 16L and the first semiconductor material layer 14L to provide the plurality of fin stack structures 20 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the illustrated embodiment, the etch stops on the topmost surface of the first insulator layer 12L.

In another embodiment of the present application, the patterning of the second semiconductor material layer 18L, the second insulator layer 16L and the first semiconductor material layer 14L to provide the plurality of fin stack structures 20 may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer can be formed by deposition of a spacer material that has a different etch selectivity than the mandrel material and then etching the deposited spacer material. In one embodiment, the spacer material may comprise any dielectric spacer material such as, for example, silicon dioxide, silicon nitride or a dielectric metal oxide. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. The etch stops on a topmost surface of the first insulator layer 12L. Upon completion of the pattern transfer, the SIT process concludes by removing the spacers from the structure. Each spacer may be removed by etching or a planarization process.

As used herein, a "fin stack structure" refers to a material stack of the first semiconductor material fin portion 14F, the insulator fin portion 16F and the second semiconductor material fin portion 18F, and including a pair of vertical sidewalls that are parallel to each other. As used herein, a surface is "vertical" if there exists a vertical plane from which the surface does not deviate by more than three times the root mean square roughness of the surface. In one embodiment of the present application, each fin stack structure has a width from 5 nm to 20 nm. Other widths that is lesser than, or greater than the range mentioned herein can also be used in the present application. Each fin stack structure 20 is spaced apart from its nearest neighboring fin stack structure 20 by a pitch of from 20 nm to 100 nm. Also, each fin stack structure 20 is oriented parallel to each other.

Figure 3:
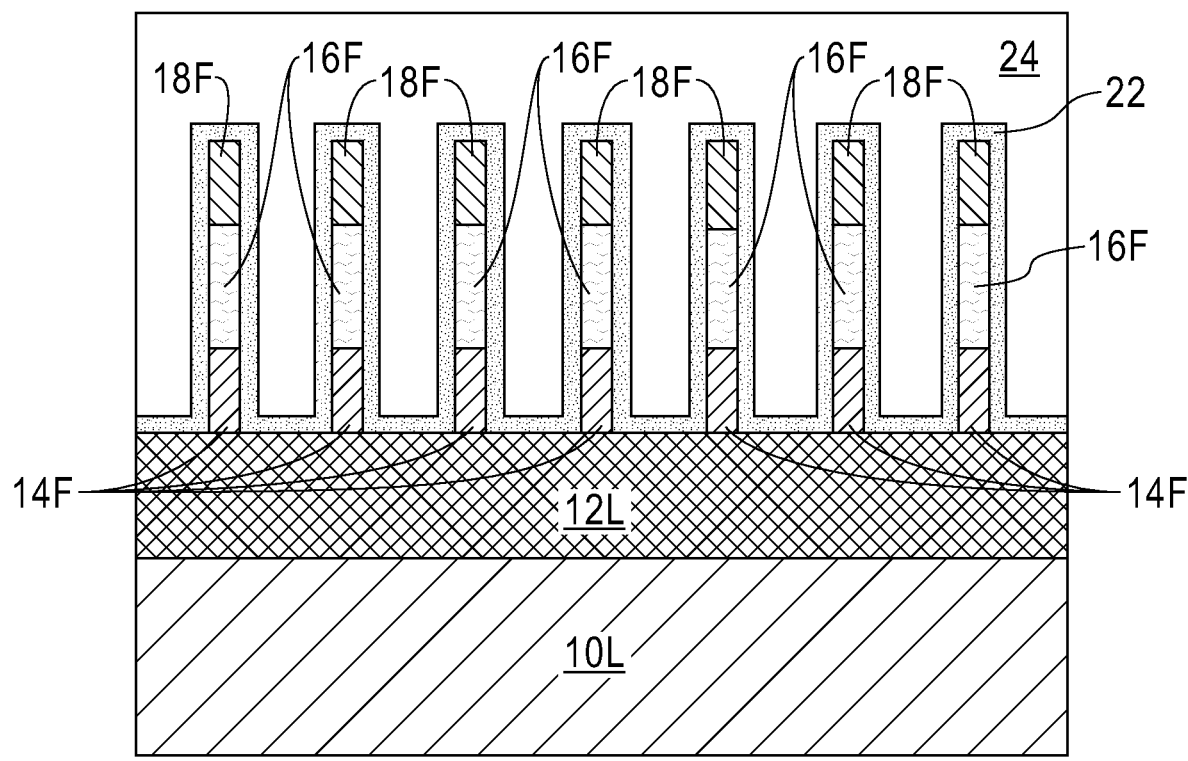
FIG. 3 is a cross sectional view of the exemplary semiconductor structure of FIG. 2 after forming a gate structure straddling over a portion of each fin stack structure of the plurality of fin stack structures.

Referring now to FIG. 3 (which is a cross sectional view that passes though each of the fin stack structures 20), there is illustrated the exemplary semiconductor structure of FIG. 2 after forming a gate structure straddling over a portion of each fin stack structure 20 of the plurality of fin stack structures. In the present application, the gate structure includes a functional or sacrificial gate structure (as defined below) and optionally a gate spacer (as defined below). Other portions of the fin stack structure 20 which run out from, and into, the plane of FIG. 3 and not including the gate stack structure 20 and, if present the gate spacer would remain exposed. The other portions of the fin stack structure 20 which run out from, and into, the plane of FIG. 3 and that are exposed can be used to form a source region and a drain region of the exemplary semiconductor structure. As is known, a source region is located on a first side of a gate structure, while the drain region is located on a second side of the gate structure which is opposite the first side.

By "straddling over" it is meant that one material is formed atop and along sidewall surfaces of another material. In one embodiment of the present application, each gate structure is a functional gate structure. By "functional gate structure" it is meant a permanent gate structure used to control output current (i.e., flow of carriers in the channel) of a semiconducting device through electrical or magnetic fields. Each functional gate structure includes a gate material stack of, from bottom to top, a gate dielectric portion 22 and a gate conductor portion 24. In some embodiments (not shown), a gate cap portion can be present atop at least the gate conductor portion 24.

The gate dielectric portion 22 may include a gate dielectric material. The gate dielectric material that provides the gate dielectric portion 22 can be an oxide, nitride, and/or oxynitride. In one example, the gate dielectric material that provides the gate dielectric portion 22 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 22. In some embodiments, a first set of functional gate structures includes a first gate dielectric portion, while a second set of functional gate structures comprises a second gate dielectric portion. In such an embodiment, the first gate dielectric material portion may be the same as, or different from, the second gate dielectric material portion.

The gate dielectric material used in providing the gate dielectric portion 22 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the gate dielectric portion 22 can have a thickness in a range from 1 nm to 10 nm. Other thicknesses that are lesser than, or greater than, the aforementioned thickness range can also be employed for the gate dielectric material that may provide the gate dielectric portion 22.

The gate conductor portion 24 can include a gate conductor material. The gate conductor material used in providing the gate conductor portion 24 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, a first set of functional gate structures includes a first gate conductor portion, while a second set of functional gate structures comprises a second gate conductor portion. In such an embodiment, the first gate conductor portion may be the same as, or different from, the second gate conductor portion. For example, the first gate conductor portion may comprise an nFET gate metal, while the second gate conductor portion may comprise a pFET gate metal. In another example, the first gate conductor portion may comprise a pFET gate metal, while the second gate conductor portion may comprise an nFET gate metal.

The gate conductor material used in providing the gate conductor portion 24 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the gate conductor portion 24 has a thickness from 20 nm to 150 nm. Other thicknesses that are lesser than, or greater than, the aforementioned thickness range can also be employed for the gate conductor material used in providing the gate conductor portion 24.

If present, gate cap portion of the functional gate structure may include a gate cap material. The gate cap material that provides the gate cap portion may include a hard mask material such as, for example, silicon dioxide, silicon nitride, and/or silicon oxynitride. When a plurality of functional gate structures are formed, the hard mask material of a first gate gap portion of a first set of functional gate structure may be the same as, or different from, the hard mask material of a second gate gap portion of a second set of functional gate structures. The hard mask material that provides the gate cap portion can be formed utilizing a conventional deposition process such as, for example, chemical vapor deposition or plasma enhanced chemical vapor deposition. The material that provides the gate cap portion can have a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. A patterning process may follow the formation of the functional gate material stack. Block mask technology may be used to selectively provide one of the functional gate structures prior to forming the other functional gate structure.

Next, a gate spacer (not shown) can be formed around each gate structure. In one embodiment, the gate spacer is present on the vertical sidewalls of the gate dielectric portion 22 and the vertical sidewalls of the gate conductor portion 24 and if present the vertical sidewalls of the gate cap portion. A base of the gate spacer may contact a topmost surface of the first insulator layer 12L. The gate spacer may include any gate dielectric spacer material such as, for example, silicon dioxide and/or silicon nitride. The gate spacer can be formed by deposition of a gate dielectric spacer material and thereafter etching the deposited gate dielectric spacer material.

In other embodiments of the present application, and prior to forming a functional gate structure, a sacrificial gate structure is formed instead. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for gate dielectric portion. Each sacrificial gate material portion includes one of the gate conductor materials mentioned above for the gate conductor portion. The sacrificial gate cap portion includes one of the gate cap materials mentioned above for the gate cap portion. The sacrificial gate structure can be formed by deposition of the various material layers and then patterning the resultant sacrificial dielectric material sack by utilizing, for example, lithography and etching. Next, gate spacers as mentioned above, and after formation of the source/drain regions, the sacrificial gate structure may be replaced with a functional gate structure as described above.

Figure 4:
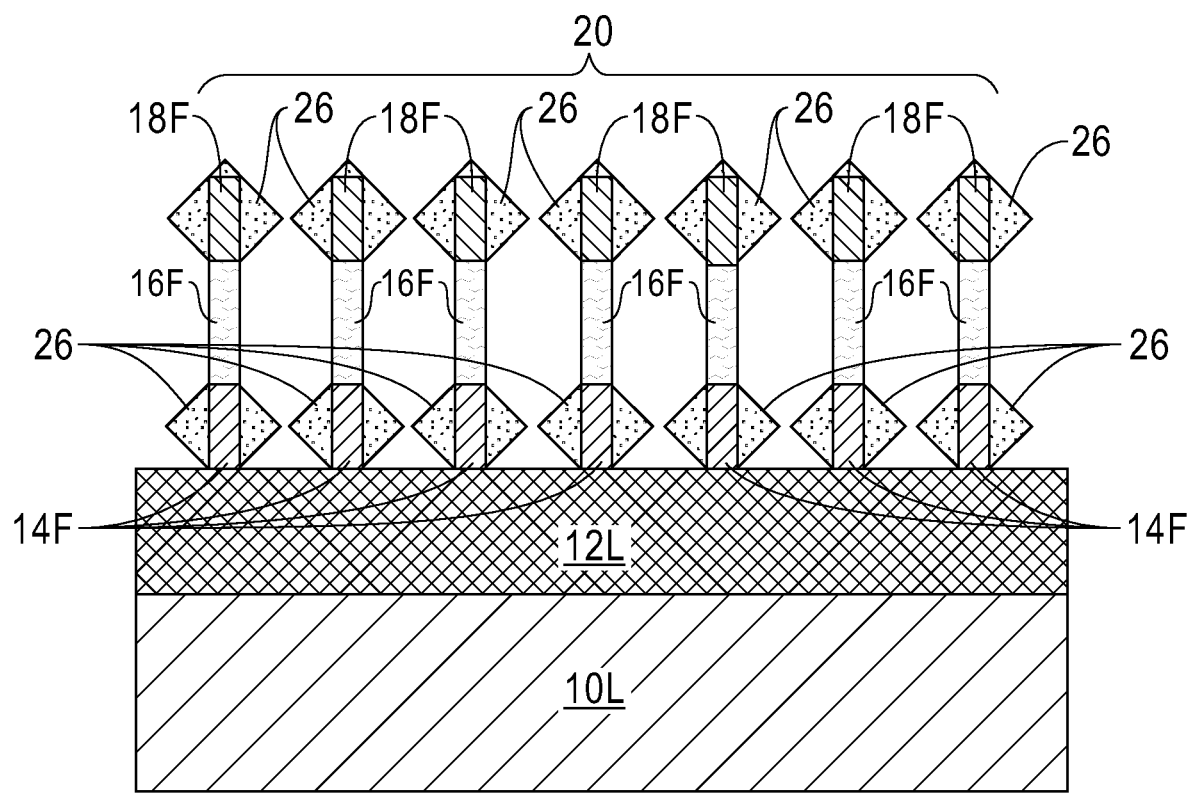
FIG. 4 is a cross sectional view of the exemplary semiconductor structure of FIG. 3 and within one of the source region or the drain region after epitaxial growth of a first epitaxial semiconductor material structure from exposed surfaces of a first semiconductor material fin portion of each fin stack structure and exposed surfaces of a second semiconductor material fin portion of each fin stack structure.

Referring now to FIG. 4 (which is within one of the source region or the drain region of the exemplary semiconductor structure), there is illustrated the exemplary semiconductor structure of FIG. 3 after epitaxial growth of a first epitaxial semiconductor material structure 26 from exposed surfaces of a first semiconductor material fin portion 14F of each fin stack structure 20 and exposed surfaces of a second semiconductor material fin portion 18F of each fin stack structure 20. FIG. 4 as well as FIGS. 5-8 that follow are located in front or behind the gate structure shown in FIG. 3; for clarity the gate structure is not shown. It is noted that the source region and the drain region of the exemplary semiconductor structure look similar to each other therefore only one of the regions is illustrated in the present application. Each first epitaxial semiconductor material structure 26 is typically unmerged with a neighboring first epitaxial semiconductor material structure 26 such that a gap exists between the two first epitaxial semiconductor material structures 26.

Each first epitaxial semiconductor material structure 26 may be formed utilizing a selective epitaxial growth (or deposition) process. The term "selective" when used in conjugation with the phrase "selective epitaxial growth" denotes that the epitaxial material is grown only on semiconductor material surfaces not insulator or conductor surfaces. Thus, in the present application, each first epitaxial semiconductor material structure 26 is formed from exposed surfaces of the first and second semiconductor material fin portions 14F, 18F that are not covered by the gate structure (including the gate spacer).

As is shown, the first epitaxial semiconductor material structure 26 provided to each first semiconductor material fin portion 14F is grown only from the exposed sidewall surfaces of the exposed portions of each first semiconductor material fin portion 14F (no growth occurs on either the bottommost surface or topmost surface of the first semiconductor material fin portion 14F since those surfaces are unavailable for epitaxial growth). The first epitaxial semiconductor material structure 26 that is grown from the exposed sidewall surfaces of the exposed portions of each first semiconductor material fin portion 14F has a first shape as shown. In one embodiment, this first shape is a triangle.

As is shown, the first epitaxial semiconductor material structure 26 provided to each second semiconductor material fin portion 18F is grown from exposed sidewall surfaces and a topmost surface of the exposed portions of each second semiconductor material fin portion 18F (no growth occurs on the bottommost surface of the second semiconductor material fin portion 18F since that surface is unavailable for epitaxial growth). The first epitaxial semiconductor material structure 26 that is grown from the exposed sidewall surfaces and topmost surface of the exposed portions of each second semiconductor material fin portion 18F has a second shape which differs from the first shape. In one embodiment, the second shape is a diamond.

Each first epitaxial semiconductor material structure 26 comprises a first epitaxial semiconductor material that is doped. The first epitaxial semiconductor material that provides each first epitaxial semiconductor material structure 26 may include one of the semiconductor materials mentioned above for the handle substrate 10L. In one example, silicon or a silicon germanium alloy may be used as the first epitaxial semiconductor material. In one embodiment, the first epitaxial semiconductor material comprise a same semiconductor material as the first semiconductor material fin portion 14F, but a different semiconductor material than the second semiconductor material fin portion 18F.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, the first epitaxial semiconductor material structure 26 has an epitaxial relationship with exposed surfaces of the first and second semiconductor material fin portions 14F, 18F.

Examples of various epitaxial growth process apparatuses that can be employed in the present application include, e.g., rapid thermal chemical vapor deposition (RTCVD), lowenergy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each first epitaxial semiconductor material structure 26 can be performed utilizing any well known precursor gas or gas mixture including for example, a silicon containing precursor gas (such as silane) and/or a germanium containing precursor gas (such as a germane). Carrier gases like hydrogen, nitrogen, helium and argon can be used.

The dopant that can be present in each first epitaxial semiconductor material structure 26 may be n-type dopant or p-type dopant. The dopant is typically introduced into the precursor gas during the epitaxial growth process. In other embodiments, a dopant can be introduced after the epitaxial growth process. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. Each first epitaxial semiconductor material structure 26 has a first dopant concentration. In one embodiment, the first dopant concentration can range from $2\times10^{20}$ atoms/cm$^3$ to $1\times10^{21}$ atoms/cm$^3$.

Figure 5:
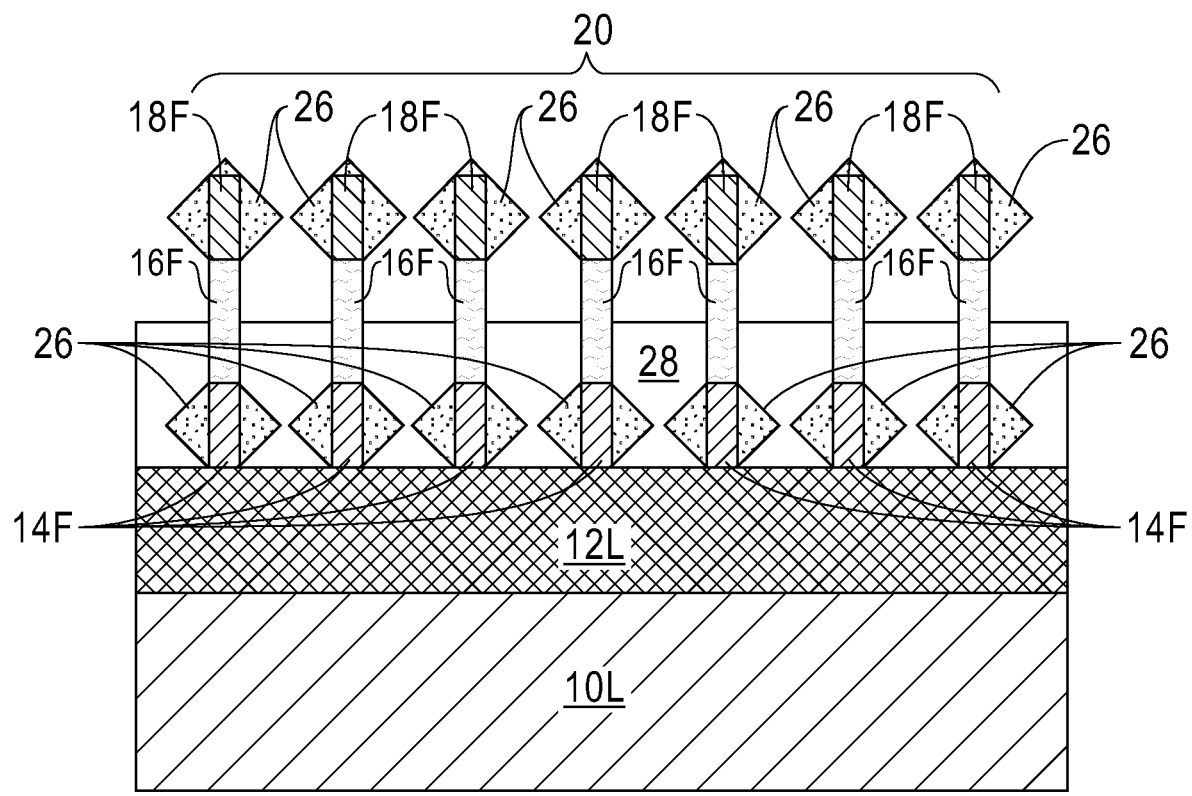
FIG. 5 is a cross sectional view of the exemplary semiconductor structure of FIG. 4 after forming a local isolation structure at the footprint of each fin stack structure and covering an entirety of the first epitaxial semiconductor material structure that is formed on exposed surfaces of the first semiconductor material fin portion of each fin stack structure.

Referring now to FIG. 5, there is illustrated the exemplary semiconductor structure of FIG. 4 after forming a local isolation structure 28 at the footprint of each fin stack structure 20 and covering an entirety of the first epitaxial semiconductor material structure 26 that is formed on exposed surfaces of the first semiconductor material fin portion 14F of each fin stack structure 20. By "footprint" is meant along the sidewalls and a bottom portion of each fin stack structure 20. The local isolation structure 28 can be formed by deposition of a trench dielectric material such as, for example, a trench oxide, and then performing an etch back process.

The local isolation structure 28 has a topmost surface that covers the entirety of each first epitaxial semiconductor material structure 26 that is formed on exposed surfaces of the first semiconductor material fin portion 14F and it is positioned at least between the bottommost and topmost surfaces of each insulator fin portion 16F; the location isolation structures 28 do not cover the first epitaxial semiconductor material structure 26 that is formed on exposed surfaces of the second semiconductor material fin portion 18F.

Figure 6:
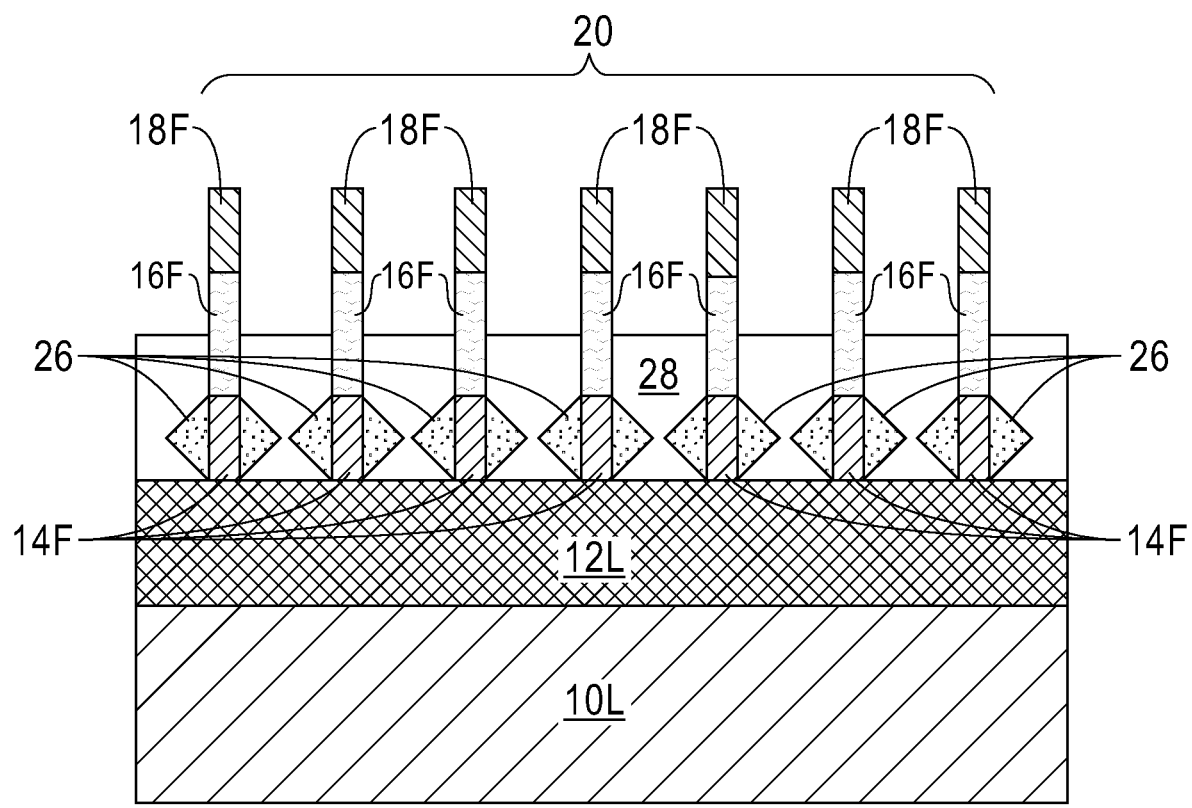
FIG. 6 is a cross sectional view of the exemplary semiconductor structure of FIG. 5 after removing the first epitaxial semiconductor material structure that is formed on exposed surfaces of the second semiconductor material fin portion of each fin stack structure.

Referring now to FIG. 6, there is illustrated the exemplary semiconductor structure of FIG. 5 after removing the first epitaxial semiconductor material structure 26 that is formed on exposed surfaces of the second semiconductor material fin portion 18F of each fin stack structure 20, while maintaining the first epitaxial semiconductor material structure 26 on each first semiconductor material fin portion 14F. The first epitaxial semiconductor material structure 26 that is formed on exposed surfaces of the second semiconductor material fin portion 18F of each fin stack structure 20 can be removed utilizing an etching process that is selective in removing the first epitaxial semiconductor material structure 26 from the exposed surfaces of the second semiconductor material fin portion 18F.

Figure 7:
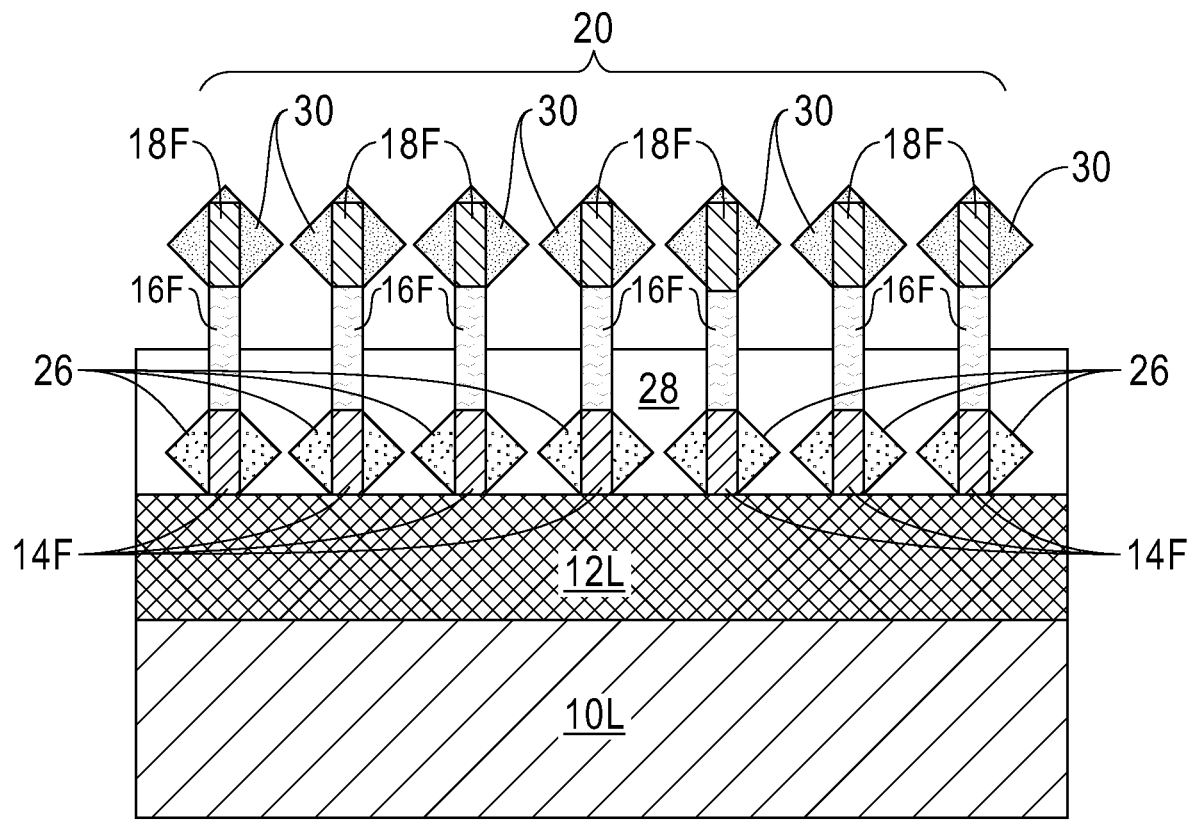
FIG. 7 is a cross sectional view of the exemplary semiconductor structure of FIG. 6 after epitaxial growth of a second epitaxial semiconductor material structure from exposed surfaces of the second semiconductor material fin portion of each fin stack structure.

Referring now to FIG. 7, there is illustrated the exemplary semiconductor structure of FIG. 6 after epitaxial growth of a second epitaxial semiconductor material structure 30 from exposed surfaces of the second semiconductor material fin portion 18F of each fin stack structure 20. In the illustrated embodiment, the growth occurs from the exposed sidewall surfaces and topmost surface of each second semiconductor material fin portion 18F. The second epitaxial semiconductor material structure 30 may be formed utilizing a selective epitaxial growth (or deposition) process as mentioned above. Each second epitaxial semiconductor material structure 30 has the second shape mentioned above. Each second epitaxial semiconductor material structure 30 is typically unmerged with a neighboring second epitaxial semiconductor material structure 30 such that a gap exists between the two second epitaxial semiconductor material structures 30.

Each second epitaxial semiconductor material structure 30 comprises a second epitaxial semiconductor material that is doped. The second epitaxial semiconductor material that provides each second epitaxial semiconductor material structure 30 may include one of the semiconductor materials mentioned above for the handle substrate 10L. The second epitaxial semiconductor material that provides each second epitaxial semiconductor material structure 30 can be the same as, or different from, the first epitaxial semiconductor material that provides each first epitaxial semiconductor material structure 26. Typically, the second epitaxial semiconductor material is a different semiconductor material than the first epitaxial semiconductor material.

The dopant that can be present in each second epitaxial semiconductor material structure 30 may be n-type dopant or p-type dopant. The dopant is typically introduced into the precursor gas during the epitaxial growth process. In other embodiments, a dopant can be introduced after the epitaxial growth process. Each second epitaxial semiconductor material structure 30 has a second dopant concentration which can be the same as, or different from, the first dopant concentration mentioned above. In one embodiment, the second dopant concentration can range from $2\times10^{20}$ atoms/cm$^3$ to $1\times10^{21}$ atoms/cm$^3$.

After forming the second epitaxial semiconductor material structure 30, an interlayer dielectric material (not shown) including one or more contact structures (also not shown) can be formed covering the source regions and the drain regions. In some embodiments and prior to formation of the interlayer dielectric material, the local isolation structure 28 may be removed. In other embodiments, the local isolation structure 28 may be maintained.

The interlayer dielectric material may have a topmost surface that is coplanar with a topmost surface of the gate structure. In some embodiments, and when a sacrificial gate structure is formed, the sacrificial gate structure can replaced with a functional gate structure after the interlayer dielectric material has been formed.

The interlayer dielectric material may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the interlayer dielectric material. The use of a self-planarizing dielectric material as interlayer dielectric material may avoid the need to perform a subsequent planarizing step.

In one embodiment, the interlayer dielectric material can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the interlayer dielectric material, a planarization process or an etch back process follows the deposition of the interlayer dielectric material. The thickness of the interlayer dielectric material that can be employed in the present application may vary depending on the type of dielectric material employed as well as the method that was employed in forming the same. In one embodiment, the interlayer dielectric material has a thickness from 80 nm to 500 nm. Other thicknesses that are greater or lesser than the range provided above can also be used for the interlayer dielectric material.

The one or more contact structures can be formed within the interlayer dielectric material by first providing a contact opening within the interlayer dielectric material by lithography and etching. The one or more contact structures can then be formed by deposition of a conductive metal or metal alloy and/or formation of a metal semiconductor alloy. In some embodiments, the one or more contact structures can include copper, aluminum, tungsten or an alloy of any of the metals. In other embodiments, the one or more contact structure includes a metal silicide in which the metal component is at least one of nickel, platinum, cobalt, and/or tungsten. In one embodiment the at least one or more contact structures includes a combination of a metal semiconductor alloy, e.g., nickel silicide, and a metal or metal alloy, e.g., copper.

The one or more contact structure may only contact the second epitaxial semiconductor material structure 30 or they may contact both the second epitaxial semiconductor material structure 30, and the underlying first epitaxial semiconductor material structure 26.

Figure 8:
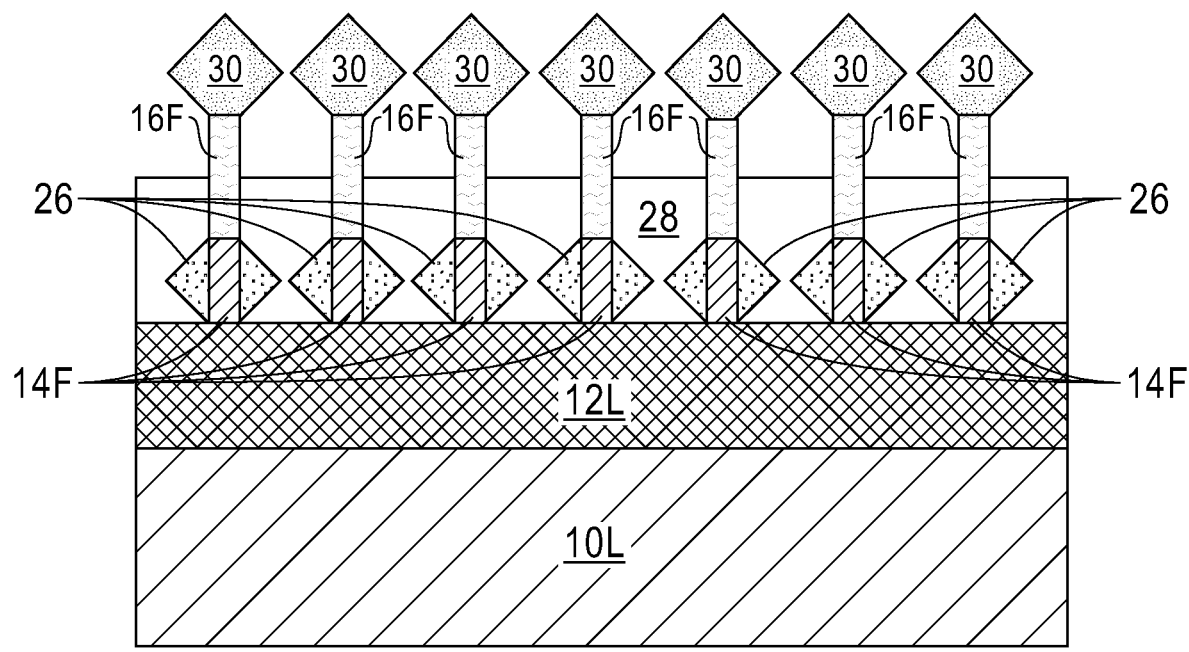
FIG. 8 is a cross sectional view of the exemplary semiconductor structure of FIG. 6 after removing each second semiconductor material fin portion of each fin stack structure from the source and drain regions and after epitaxial growth of a second epitaxial semiconductor material structure from exposed surfaces of a remaining portion of the second semiconductor material fin portion that is located beneath the gate structure and, if present, a gate spacer.

Referring now to FIG. 8, there is illustrated the exemplary semiconductor structure of FIG. 6 after removing each second semiconductor material fin portion 18F of each fin stack structure 20 from the source and drain regions (the second semiconductor material fin portion 18F is not removed from areas of the exemplary semiconductor structure that are located beneath the gate structure including the optional gate spacer) and after epitaxial growth of a second epitaxial semiconductor material structure 30 from exposed surfaces of a remaining portion of the second semiconductor material fin portion 18F that is located beneath the gate structure and, if present, the gate spacer. In this embodiment, each second epitaxial semiconductor material structure 30 has a bottommost surface that is located above, and in some embodiments may directly contact, a topmost surface of the underlying insulator fin portion 16F.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
providing a material stack of, from bottom to top, a handle substrate, a first insulator layer, a first semiconductor material layer, a second insulator layer and a second semiconductor material layer;
patterning said second semiconductor material layer, said second insulator layer and said first semiconductor material layer to provide at least one fin stack structure extending upwards from a portion of said first insulator layer, said at least one fin stack structure comprises, from bottom to top, a first semiconductor material fin portion, an insulator fin portion and a second semiconductor material fin portion;
forming a gate structure straddling over a portion of said at least one fin stack structure
epitaxially growing a first epitaxial semiconductor material structure from exposed surfaces of said first semiconductor material fin portion and exposed surfaces of said second semiconductor material fin portion;
forming a local isolation structure at a footprint of said at least one fin stack structure, said local isolation structure having a bottommost surface that is coplanar with a bottommost surface of said first semiconductor fin portion and a topmost surface that entirely covers said first epitaxial semiconductor material structure formed on said first semiconductor material fin portion, while leaving said first epitaxial semiconductor material structure formed on said second semiconductor material fin portion exposed;
removing said first epitaxial semiconductor material structure formed on said second semiconductor material fin portion;
removing an exposed portion of said second semiconductor material fin portion not protected by said gate structure to physically exposed a portion of a topmost surface of said insulator fin portion not protected by said gate structure; and
epitaxially growing a second epitaxial semiconductor material structure from an exposed surface of a remaining portion of said second semiconductor material fin portion that is present beneath said gate structure, wherein a surface of the second epitaxial semiconductor material structure directly contact the physically exposed portion of said topmost surface of said insulator fin portion not protected by said gate structure.

2. The method of claim 1, wherein said first semiconductor material layer comprises a first semiconductor material and said second semiconductor material layer comprises a second semiconductor material that differs from said first semiconductor material.

3. The method of claim 1, wherein said second epitaxial semiconductor material structure comprises a different semiconductor material than a semiconductor material of said first epitaxial semiconductor material structure.

4. The method of claim 1, wherein said second epitaxial semiconductor material structure has a shape that differs from a shape of said first epitaxial semiconductor material structure.

5. The method of claim 1, wherein said providing said material stack comprises:
providing a first substrate comprising, from bottom to top, said handle substrate, said first insulator layer, and said first semiconductor material layer;
providing a second substrate comprising, from bottom to top, said second semiconductor material layer and said second insulator layer; and
bonding said first substrate to said second substrate, wherein said bonding includes contacting an exposed surface of said second insulator layer to an exposed surface of said first semiconductor material layer.

6. The method of claim 5, wherein said second semiconductor layer is provided by:
forming a stack of silicon and a silicon germanium alloy having a first germanium content; and
converting said stack of said silicon and said silicon germanium alloy having said first germanium content into a silicon germanium alloy layer having a second germanium content that differs from said first germanium content.

7. The method of claim 1, wherein said insulator fin portion is located entirely between a bottommost surface of said second semiconductor material fin portion and a topmost surface of said first semiconductor material fin portion.

8. The method of claim 1, wherein said first semiconductor material fin portion is composed of strained silicon and said second semiconductor material fin portion is composed of a silicon germanium alloy.

9. The method of claim 1, wherein said first semiconductor material fin portion has sidewalls that are vertically aligned to sidewalls of the insulator fin portion and sidewalls of the second semiconductor material fin portion.

10. The method of claim 1, wherein said forming of said gate structure comprises forming a sacrificial gate structure, and wherein the sacrificial gate structure is replaced with a functional gate structure after said forming of said first and second epitaxial semiconductor material structures.

11. The method of claim 1, wherein said forming of said gate structure comprises forming a functional gate structure prior to said forming of said first and second epitaxial semiconductor material structures.

12. The method of claim 1, wherein said forming of said first epitaxial semiconductor material structure comprises a first selective epitaxial growth process, and the forming of the second epitaxial semiconductor material structure comprises a second selective epitaxial growth process.

* * * * *